United States Patent
Chen et al.

(10) Patent No.: US 10,757,843 B2
(45) Date of Patent: Aug. 25, 2020

(54) VEHICULAR TRACTION INVERTER TEMPERATURE CONTROL SYSTEM

(71) Applicant: Ford Global Technologies, LLC, Dearborn, MI (US)

(72) Inventors: Lihua Chen, Farmington Hills, MI (US); Baoming Ge, Okemos, MI (US); Fan Wang, Novi, MI (US); Shahram Zarei, Farmington Hills, MI (US); Fan Xu, Novi, MI (US); Mohammed Khorshed Alam, Canton, MI (US); Yan Zhou, Canton, MI (US); Shuitao Yang, Beaumont, TX (US); Petros G. Taskas, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 296 days.

(21) Appl. No.: 15/870,181

(22) Filed: Jan. 12, 2018

(65) Prior Publication Data
US 2019/0223330 A1    Jul. 18, 2019

(51) Int. Cl.
*H05K 7/20* (2006.01)
*B60L 3/00* (2019.01)
*B60L 15/00* (2006.01)

(52) U.S. Cl.
CPC .......... *H05K 7/20945* (2013.01); *B60L 3/003* (2013.01); *B60L 15/007* (2013.01); *H05K 7/20272* (2013.01); *H05K 7/20927* (2013.01); *B60L 2240/525* (2013.01); *B60Y 2306/05* (2013.01)

(58) Field of Classification Search
CPC .......... H05K 7/20945; H05K 7/20272; H05K 7/20927; B60L 3/003; B60L 2240/525
USPC ....................................................... 340/438
See application file for complete search history.

(56) References Cited

U.S. PATENT DOCUMENTS

| | | | |
|---|---|---|---|
| 6,450,275 B1 * | 9/2002 | Gabriel | B60K 6/22 165/41 |
| 7,736,814 B2 * | 6/2010 | Igarashi | H01M 8/04007 429/429 |
| 8,151,917 B2 | 4/2012 | Suzuki | |
| 8,649,931 B2 | 2/2014 | Nishizawa | |
| 8,810,418 B2 * | 8/2014 | Houle | B60K 17/08 340/606 |
| 9,590,259 B2 * | 3/2017 | Toida | B60L 1/003 |
| 2014/0262195 A1 | 9/2014 | Lee | |

* cited by examiner

*Primary Examiner* — John A Tweel, Jr.
(74) *Attorney, Agent, or Firm* — David Kelley; Brooks Kushman P.C.

(57) ABSTRACT

A vehicular system includes a pump, configured to circulate coolant for a traction inverter, and a controller. The controller may be configured to, responsive to each of a temperature of the traction inverter falling outside a first range or a requested flow rate of the pump falling outside a second range, operate the pump at a predefined speed, otherwise, operate the pump at a speed based on a difference between the temperature and a temperature associated with the coolant.

18 Claims, 7 Drawing Sheets

VEHICULAR TRACTION INVERTER TEMPERATURE CONTROL SYSTEM

TECHNICAL FIELD

This application generally relates to a temperature control system for an electrified vehicle's traction power electronics.

BACKGROUND

Electrified vehicles such as hybrid-electric vehicles (HEVs) rely on power electronics to control an electrified powertrain. During operation, the power electronics generate heat that is generally proportional to power loss of the power electronics during operation.

SUMMARY

A vehicular system includes a pump, configured to circulate coolant for a traction inverter, and a controller. The controller may be configured to, responsive to each of a temperature of the traction inverter falling outside a first range or a requested flow rate of the pump falling outside a second range, operate the pump at a predefined speed, otherwise, operate the pump at a speed based on a difference between the temperature and a temperature associated with the coolant.

A method, by a controller, includes responsive to a temperature of a traction inverter exceeding a first threshold, operate a pump to circulate coolant at a predefined speed, responsive to a requested flow rate of the pump exceeding a second threshold, operate the pump at the predefined speed, and otherwise, operate the pump at a speed based on a difference between the temperature and a junction temperature of the traction inverter.

A vehicular system includes a pump, configured to circulate coolant for a traction inverter, and a controller. The controller may be configured to, responsive to a temperature of the traction inverter falling within a first range and a requested flow rate of the pump falling outside a second range, operate the pump at one of two predefined speeds, responsive to the temperature falling within the first range and the requested flow rate falling within the second range, operate the pump at a speed based on a difference between the temperature and a junction temperature of the traction inverter, and responsive to the temperature falling outside the first range, operate the pump at one of the two predefined speeds.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, hut merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

In a Hybrid Electric Vehicle (HEV)/Electric Vehicle (EV), drive systems Power electronics include an Inverter System Controller (ISC) and a DC/DC converter. The ISC includes a DC/AC inverter for an electric machine (e.g., a motor inverter or a generator inverter), and a Variable Voltage Converter (VVC). The ISC is a key component to transferring power between a traction battery and an electric machine (motor/generator). The DC/DC converter is a key component to generate low voltage for low voltage load from a traction battery. Power losses that occur during ISC operation include losses from power switches such as IGBTs/diodes of motor/generator inverter, and losses from power inductor and IGBTs/diodes of the variable voltage converter (VVC). The majority of the power losses are converted to heat in the power switches/diodes such that if the heat is not dissipated, a junction temperature of the power switches/diodes and inductor temperature will increase. If temperature of the power switches exceeds a limitation or threshold, (e.g., 115° C., 125° C., or 150° C.) physical damage to the power switch or module may occur. To remove some of the heat generated by the power electronics, the ISC generally includes a cooling system that circulates a cooling fluid (e.g., coolant such as water, ethylene glycol, diethylene glycol, or propylene glycol) to dissipate the heat and regulate the temperatures of IGBT/diode and inductor within an operating range. Generally, the coolant has a high thermal capacity, a low viscosity, with properties including non toxic, chemically inert, corrosion resistant, and electrically an insulator. The coolant may be circulated through the cooling circuit by a pump (e.g., an electrical pump). Often the operation of an electric pump in a cooling system is simply on or off and the pump speed is often operated at a relatively constant speed when on. However, at high coolant flow rates the thermal resistance (i.e., the resistance to the motion of heat transferring from the power device/module to the coolant) to dissipate heat from IGBT/diode and inductor decreases thereby increasing heat dissipation, while at low coolant flow rates the thermal resistance increases thereby decreasing heat dissipation. The thermal resistance is a function of a heat sink area, a contact area between coolant and power device. Therefore, a controller may be used to vary a speed of the pump to adjust a coolant flow rate and thereby adjust heat dissipation. Implementation of a variable speed pump increases cost and complexity, however, when balanced with the advantage of decreasing power consumption by operating the pump at lower speeds when the higher speed is not required offsets. For example, pump operation at high speeds produces a high coolant flow rate, but the pump consumes more power. And a low coolant flow rate resulting from a low pump speed consumes less power from pump accordingly. As an example, consider an example pump, doubling that pump's rotational speed, doubles the flow, and increases the pressure by a factor of four. However, to double the rotational speed, the power required increases by a factor of 8.

Generally traditional ISC cooling system operate with two control modes: in the first control mode, the coolant flow rate is on at a (maximum) constant value as soon as the system is powered on. This ensures cooling of power electronics (e.g., IGBTs/diodes and inductors) under a worst case scenario (e.g., highest power loss and highest coolant temperature). In the second control mode, the coolant flow rate is turned off (e.g., zero) when the system enters an idle mode. As a result, traditional coolant flow rate control has shortcomings and an HEV/EV generally operates in many load conditions. For example, during times of high power flow through the ISC may result in high power loss that in turn produces more heat, thus a high coolant flow rate may be required to cool down the power electronics (e./g., IGBTs/diodes and inductors). And during times of low power flow through the ISC may result in low power loss that produces little heat, thus a low coolant flow rate is enough to cool down the power electronics (e.g., IGBTs/diodes and inductor). During the low power flow condition, the use of a high coolant flow rate requires the pump to consume more energy than needed because a low flow rate is enough. By reducing the flow rate, the system may reduce wasted energy thereby increasing an effective range of the HEV/EV.

Also, the power module lifetime may be shortened if the lowest constant coolant flow rate is maintained due to insufficient cooling of power module components during operation that may result in higher temperature swings and temperature cycling. Generally, temperature change may result in mechanical force stress so temperature cycling may increase the impact of the mechanical force stress. A dramatic change of a power device (e.g., IGBT/diode) junction temperature may result in high mechanical force on the power device (e.g., IGBT/diode) integrated circuit, chip, or package that may shorten an operational lifetime. While a traditional cooling system operating at a maximum coolant flow rate may maintain a low junction temperature at high load power output and at low load power output. However, there is an extra pump power used during periods of low power output, which can be reduced.

Figure 1:
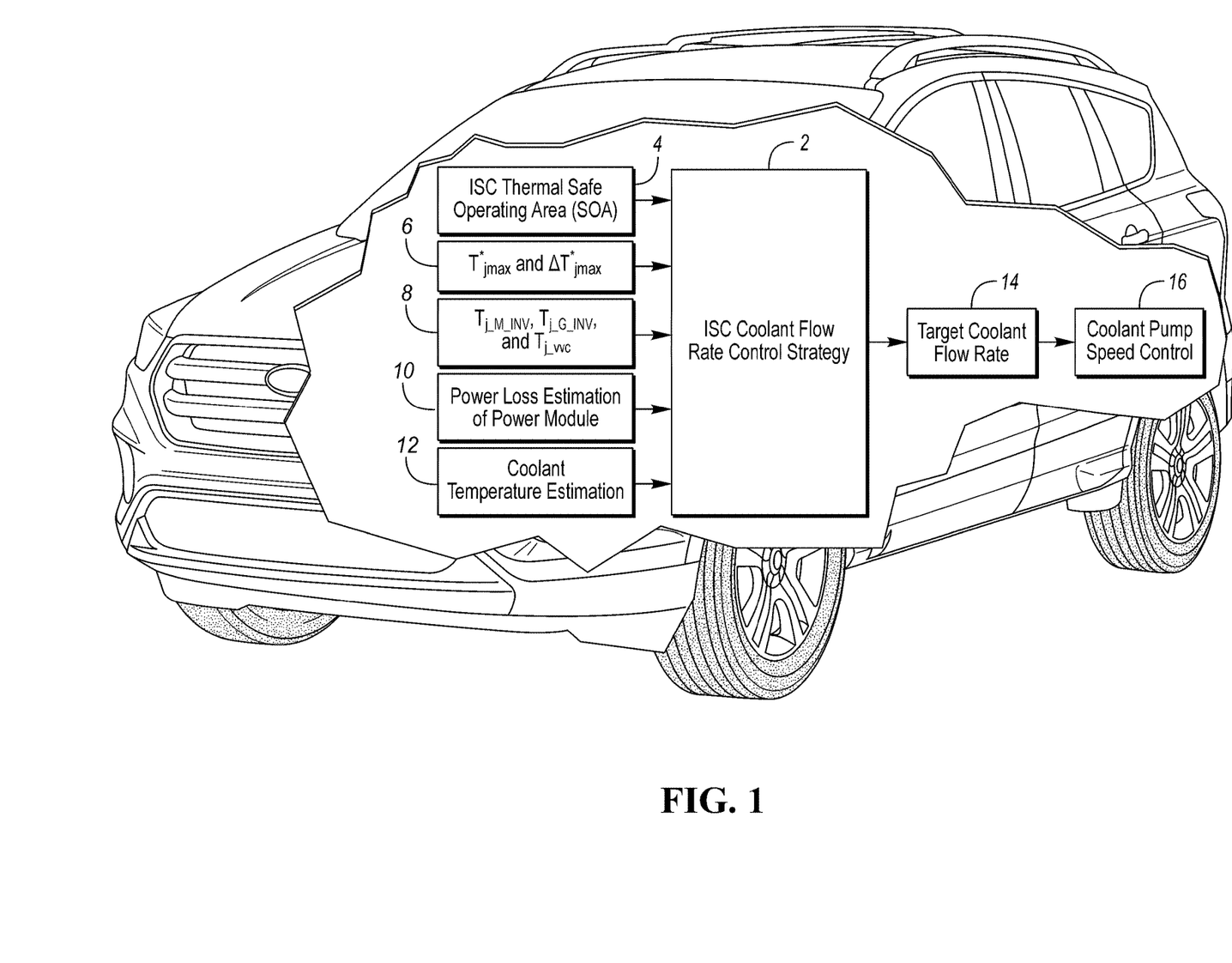
FIG. 1 is a flow diagram of a temperature control system for vehicle power electronics.

FIG. 1 is a flow diagram of a temperature control system for vehicle power electronics. Here a coolant flow rate control system is configured to achieve cooling optimization of an ISC by automatically adapting cooling system operation with HEV/EV operational status to optimize coolant pump power consumption with IGBT/diode junction temperature changes.

The coolant flow rate control system of FIG. 1 includes multiple steps. First, in block 4 an ISC thermal safe operating area (SOA) or operating area is calculated. Based on a relation between an ISC coolant temperature and the coolant flow rate, a Safe Operation Area (SOA) may be defined as an operating region within which the ISC ensures capability of maximum power/current output under any circumstance, such as a drive demand max torque/power delivery. The SOA boundary defines a minimal coolant flow rate for any given coolant temperature, and while controlling the coolant pump flow rate, a minimal flow rate must be met in order to satisfy vehicle dynamic performance such as sudden Wide Open Throttle (WOT) without overheat the power devices.

The ISC SOA is defined to facilitate power device operation under worst case conditions in which the power module produces the highest power loss and heat. This typically occurs when the ISC delivers maximum load power. Based on the control system even in a worst case event, the junction temperature (Tj) should be less than a threshold temperature, (e.g., 125° C. or 150° C.).

Additionally, a coolant flow rate and coolant temperature may significantly affect the junction temperature. Thermal resistance (Rth) is a function of coolant flow rate, power module chip size, and material properties, so flow rate change will influence heat dissipation of power module. For each coolant flow rate, a maximum allowable coolant temperature may be represented by the following equation:

$$T_{collant}=150-\Delta T=150-P_{loss}*R_{th} \tag{1}$$

where $P_{loss}$, is the power loss when ISC inverter outputs maximum current at the highest DC bus voltage. This may also be referred to as a coolant operational limit.

Next in step 6, a controller may define a maximum IGBT/diode junction temperature reference $T^*_{jmax}$ and a maximum temperature variation $\Delta T^*_{jmax}$ of the junction temperature. A $\Delta Tj$ is defined as an averaged Power Module (PM) junction temperature rise over a period, (e.g. 5 s, 10 s, or 20 s). Such a control target $\Delta T^*_{jmax}$ is set up to adaptively change based on various drive patterns such as city drive, highway drive, mountain climbing or cruising. The $\Delta T^*_{jmax}$ may also be set up to avoid Power Module (PM) continuous high temperature cycling (e.g., changes of 50 C or higher), which may increase PM wear and possibly shorten a PM lifetime. The Power Module (PM) includes a power device such as an insulated gate bipolar junction transistor (IGBT), a metal oxide semiconductor field effect transistor (MOSFET), a diode, a solenoid, an inductor, a capacitor, a resistor, a conductor, or a contact.

The Power Module (PM) peak junction temperature rise $T^*_{jmax}$ is a control target which is set up to provide a fast response (e.g., 0.5, 1, 5, or 10 milliseconds) to dynamic or transient high-power output demands, like vehicle sudden acceleration after some time stop before a traffic light. A transient high-power output demand includes a power output rate of change that exceeds a threshold. The $T^*_{jmax}$ may be set up to adapt to various environmental conditions such as hot or cold regions, high or low elevations, humid or dry locations, or year-round four-season operation. The may have two values and $T^*_{jmax-1}$ and $T^*_{jmax-2}$ such that ($T^*_{jmax-1}<T^*_{jmax-2}$) which are designed to control ISC thermal operation within a safe guard band.

In step 8 a controller senses an IGBT/diode junction temperature of a motor inverter ($T_{j\_M\_INV}$), an IGBT/diode junction temperature of a generator inverter ($T_{j\_G\_INV}$), and an IGBT/diode junction temperature of a variable voltage converter (VVC) ($T_{j\_vvc}$). In step 10, the controller estimates power loss of the module, and in step 12, the controller estimates the coolant temperature. These inputs to the ISC coolant flow rate control strategy 2 produce a target flow rate of the coolant in step 14 that is then used to control a speed of the coolant pump motor in step 16.

Figure 2:
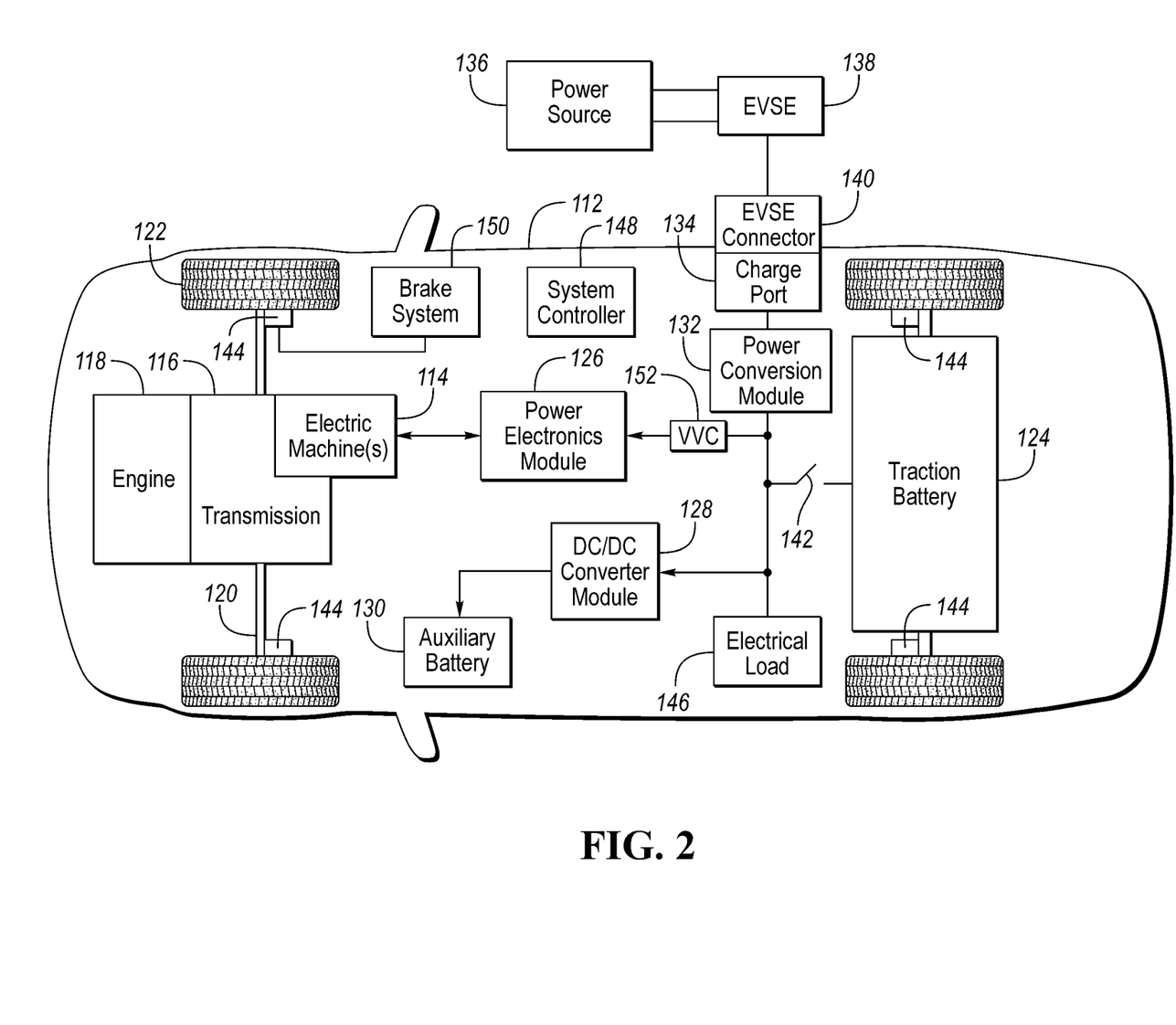
FIG. 2 is a diagram of a hybrid vehicle illustrating typical drivetrain and energy storage components.

FIG. 2 depicts a vehicle, and specifically an electrified vehicle 112 that may be referred to as a plug-in hybrid-electric vehicle (PHEV). Although a PHEV is illustrated in FIG. 2, the concepts also apply to traditional vehicles as elements of a traditional vehicle are a sub-set of the components shown in the EV 112. Here, a plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high-voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC). The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the DC bus voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high-voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 2 but it may be implied that the vehicle network may connect to any electronic module that is present in the vehicle 112. A vehicle system controller (VSC) 148 may be present to coordinate the operation of the various components.

Often the VVC 152 is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller that monitors and controls electrical parameters (e.g., voltage and current) at various locations within the VVC 152. In some configurations, the VVC controller may be included as part of the VVC 152. The VVC controller may determine an output voltage reference, $V^*_{dc}$. The VVC controller may determine, based on the electrical parameters and the voltage reference, $V^*_{dc}$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller may command the VVC 152 to provide the desired output voltage using the control signal. The particular control signal at which the VVC 152 is operated may be directly related to the amount of voltage boost to be provided by the VVC 152.

With reference to FIG. 2, the VVC 152 may boost or "step up" the voltage potential of the electrical power provided by the traction battery 124. The traction battery 124 may provide high-voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor may be electrically coupled in parallel with the traction battery 124. The input capacitor may reduce any voltage and current ripple. The VVC 152 may receive the HV DC power and boost or "step up" the voltage potential of the input voltage according to the duty cycle. Often an output capacitor is electrically coupled between the output terminals of the VVC 152 and the input of the power electronics module 126 to stabilize the bus voltage and reduce voltage and current ripple at the output of the VVC 152.

Figure 3:
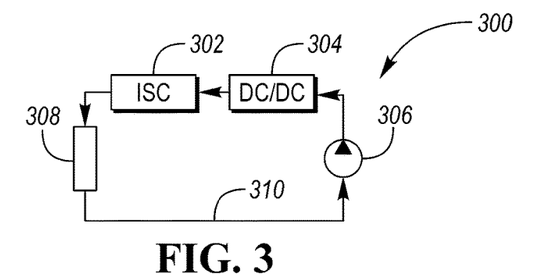
FIG. 3 is a schematic diagram of a cooling system for power electronics of an electrified vehicle.

FIG. 3 is a schematic diagram of a cooling system 300 for power electronics of an electrified vehicle. The cooling system 300 includes an ISC 302, a DC/DC converter 304, a coolant pump 306 (e.g., an electrical pump) and a radiator 308. Here, coolant flows through a series of pipes and appliances 310 to remove heat from a DC/DC converter and an ISC. In this illustration, there is a single ISC and DC/DC converter, however in other embodiments there may be multiple ISCs or DC/DC converters. Also, in this illustration, the ISC and DC/DC converter are coupled in series, however, the cooling system may be configured such that the ISC and the DC/DC converter are coupled in parallel. In another embodiment, with multiple elements within an ISC, the elements may be in series, parallel, or a combination of both series and parallel, wherein the elements include a heat sink for a power electronic device, a semiconductor device, a mechanical device, or a conductor. An advantage of having elements in parallel is that a gate valve may be added to control the flow of coolant thus allowing coolant to flow to some devices while inhibiting coolant from flowing to other devices, thereby maximizing the cooling effect of the coolant.

Figure 4:
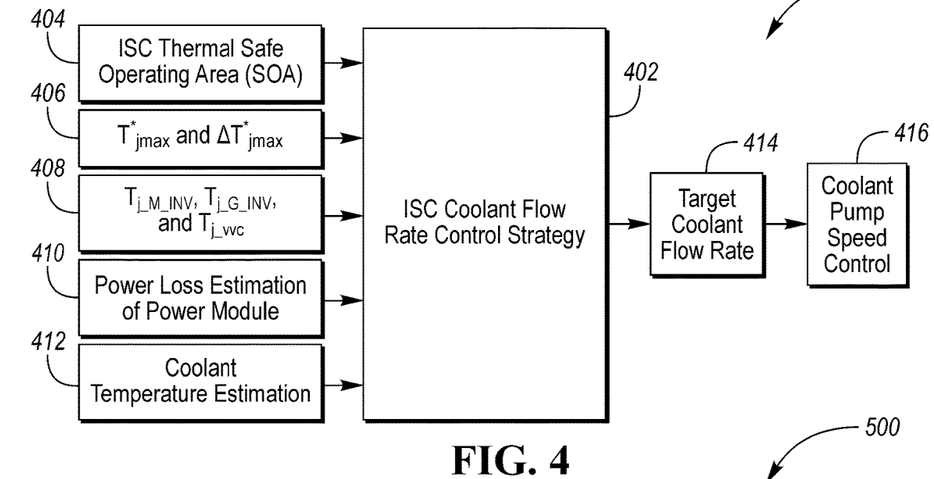
FIG. 4 is a temperature control system flow diagram for a traction power electronics system of an electrified vehicle.

FIG. 4 is a temperature control system flow diagram 400 for a traction power electronics system of an electrified vehicle. The coolant flow rate control system of FIG. 4 includes multiple steps. First, in block 404, a controller calculates an ISC thermal safe operating area (SOA) or operating area. Based on a relation between an ISC coolant temperature and the coolant flow rate, a Safe Operation Area (SOA) that may be defined as an operating region within which the ISC operates to ensure capability of maximum power/current output under any circumstance, such as a drive demand max torque/power delivery. The SOA boundary defines a minimal coolant flow rate for a given coolant temperature, and while controlling the coolant pump flow rate, a minimal flow rate must be met in order to satisfy vehicle dynamic performance changes (e.g., a sudden Wide-Open Throttle (WOT)) without overheat the power devices.

The ISC SOA is defined to facilitate power device operation under worst case conditions in which the power module produces the highest power loss and heat. This typically occurs when the ISC delivers maximum load power. Based on the control system, the junction temperature (Tj) should be less than a threshold temperature, e.g., 125° C. or 150° C.) even in a worst case event.

As previously disclosed, a coolant flow rate and coolant temperature may significantly affect the junction temperature. As thermal resistance (Rth) is a function of coolant flow rate, power module chip size, and material properties, so flow rate change will influence heat dissipation of power module. For each coolant flow rate, a maximum allowable coolant temperature may be represented by equation 1 disclosed above.

Next, the controller in step 406 defines the maximum IGBT/diode junction temperature reference $T^*_{jmax}$ and the maximum variation of the $\Delta T^*_{jmax}$ of the junction temperature. The $\Delta Tj$ (averaged Power Module (PM) junction temperature rise over a period) may be over a period of 5, 10, 15, or 20 seconds. Such a control target $\Delta T^*_{jmax}$ is set up to adaptively change based on various drive patterns such as city driving, highway driving, mountain climbing or cruising, or environmental conditions, such as hot or cold temperatures, humid or dry conditions, or high or low elevations. The $\Delta T^*_{jmax}$ may also be set up to avoid Power Module (PM) continuous high temperature cycling (e.g., changes of 50 C or higher), which may increase PM wear and possibly shorten a PM lifetime.

The Power Module (PM) peak junction temperature $T^*_{jmax}$ is a control target which is set up to fast response (e.g., 0.5, 1, 5, or 10 milliseconds) to dynamic or transient high-power output demands, like vehicle sudden acceleration after some time stop before a traffic light. A transient high-power output demand includes a power output rate of change that exceeds a threshold. The $T^*_{jmax}$ may be set up to adapt to various environmental conditions such as hot or cold regions, high or low elevations, humid or dry locations, or year-round four-season operation. The $T^*_{jmax}$ may have two values $T^*_{jmax-1}$ and $T^*_{jmax-2}$ such that ($T^*_{jmax-1} < T^*_{jmax-2}$) which are designed to control ISC thermal within a safe guard band.

In step 408 a controller senses an IGBT/diode junction temperature of a motor inverter ($T_{j\_M\_INV}$), an IGBT/diode junction temperature of a generator inverter ($T_{j\_G\_INV}$), an IGBT/diode junction temperature of a variable voltage converter (VVC) ($T_{j\_vvc}$). The temperature sensing may be performed by a thermocouple coupled with the power device, or a structure, monolithically integrated with the power device, configured to measure temperature (e.g., a diode or other structure monolithically integrated with a power device such as an IGBT).

In step 410, the controller estimates power loss of the module, and in step 412, the controller estimates the coolant temperature. These inputs to the ISC coolant flow rate control strategy 402 produce a target flow rate of the coolant in step 414 that is then used to control a speed of the coolant pump motor in step 416.

Figure 5:
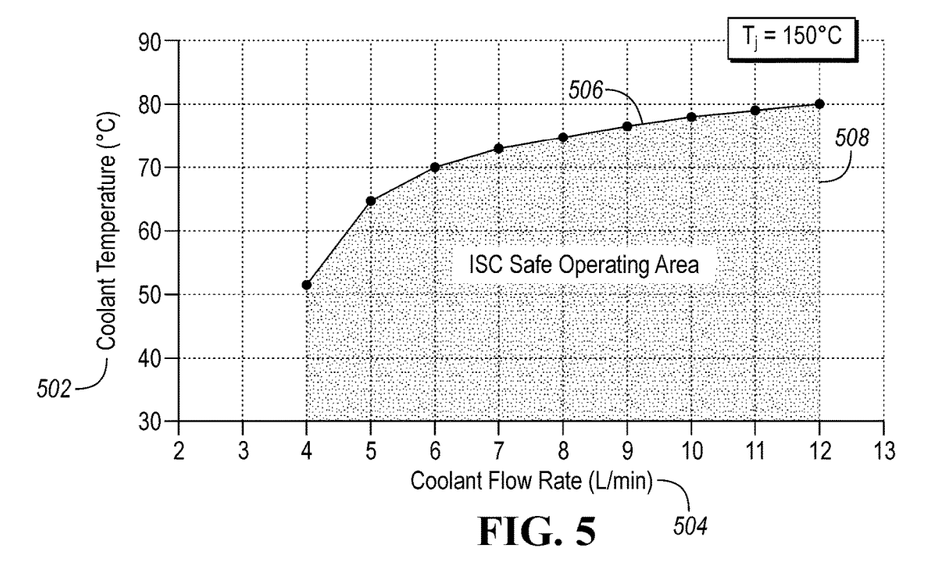
FIG. 5 is a graphical illustration of a coolant temperature in relation to a flow rate of the coolant for a traction power electronics system.

FIG. 5 is a graphical illustration 500 of a coolant temperature 502 in relation to a flow rate 504 of the coolant for a traction power electronics system. For a given coolant temperature 502 there is a coolant flow rate that may be calculated based on a relationship such as $T_{coolant}$=150−$\Delta T$=150−$P_{loss}*R_{th}$ in which $P_{loss}$ is the power loss when ISC inverter outputs maximum current at the highest DC bus voltage and $R_{th}$ varies when flow rate changes, therefore having multiple operating points 506 based on the flow rate vs. coolant temperature curve such that operation in the Safe Operating Area (SOA) 508 will keep the power devices below the temperature threshold. When this relationship is used in the control strategy of FIG. 4, the coolant flow rate 504 is output as a setpoint at which the controller operates the pump at.

Figure 6:
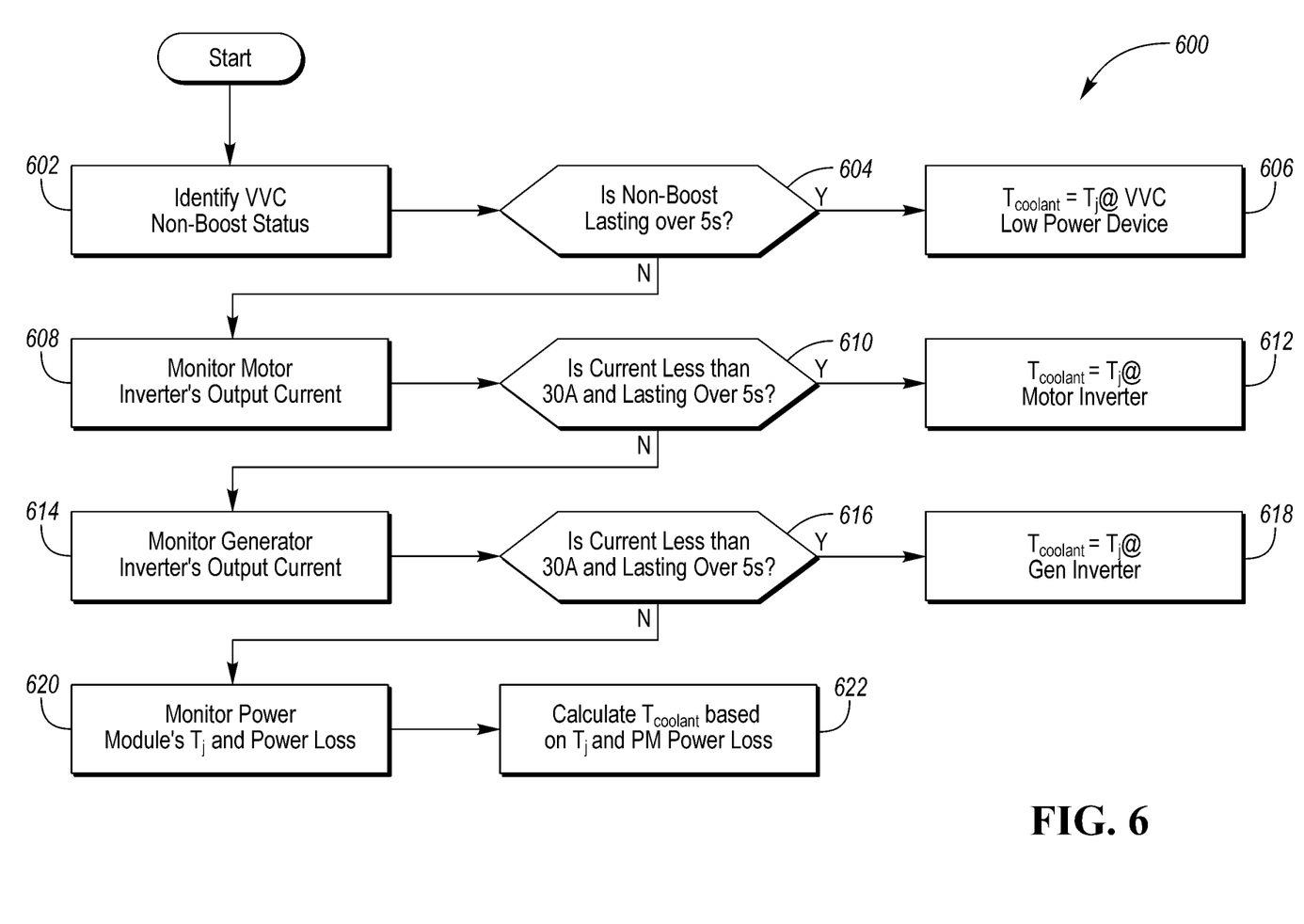
FIG. 6 is a coolant temperature estimation flow diagram for a traction power electronics system of an electrified vehicle.

FIG. 6 is a coolant temperature estimation flow diagram 600 for a traction power electronics system of an electrified vehicle. In step 602, a controller receives a power converter (e.g., VVC) non-boost status (e.g., operating in a non-boost mode) and proceeds to step 604 in which the controller will branch based on a time duration of the non-boost status exceeding a threshold. If the non-boost status exceeds the threshold, the controller will branch to step 606 and output a coolant temperature equal to a junction temperature of a power device of the VVC. Otherwise, the controller will branch to step 608 and the controller will monitor the power inverter output current for an electric machine configured as a motor and proceed to step 610. In step 610, the controller will branch based on the output current being less than a threshold current for a period of time. Here, the threshold is shown to be 30A, however this threshold may be different based on the design and drive capabilities of the electric powertrain. If the current is less than the threshold for a period of time greater than a time threshold, the controller will branch to step 612 and set the coolant temperature to a junction temperature of a power device of the motor inverter. Otherwise, the controller will branch to step 614. In step 614, the controller will monitor the power inverter output current for an electric machine configured as a generator and proceed to step 616. In step 616, the controller will branch based on the output current being less than a threshold current for a period of time. If the current is less than the threshold for a period of time greater than a time threshold, the controller will branch to step 618 and set the coolant temperature to a junction temperature of a power device of the generator inverter. Otherwise, the controller will branch to step 620. In step 620, the controller will monitor the power module's junction temperature and power loss and proceed to step 622. In step 622, the controller will calculate the coolant temperature based on the junction temperature and power loss as if the current is greater than the threshold, or the time is less than the period of time, the system has not reached equilibrium and therefore the power loss of the power electronics should be considered in the calculation.

Figure 7A:
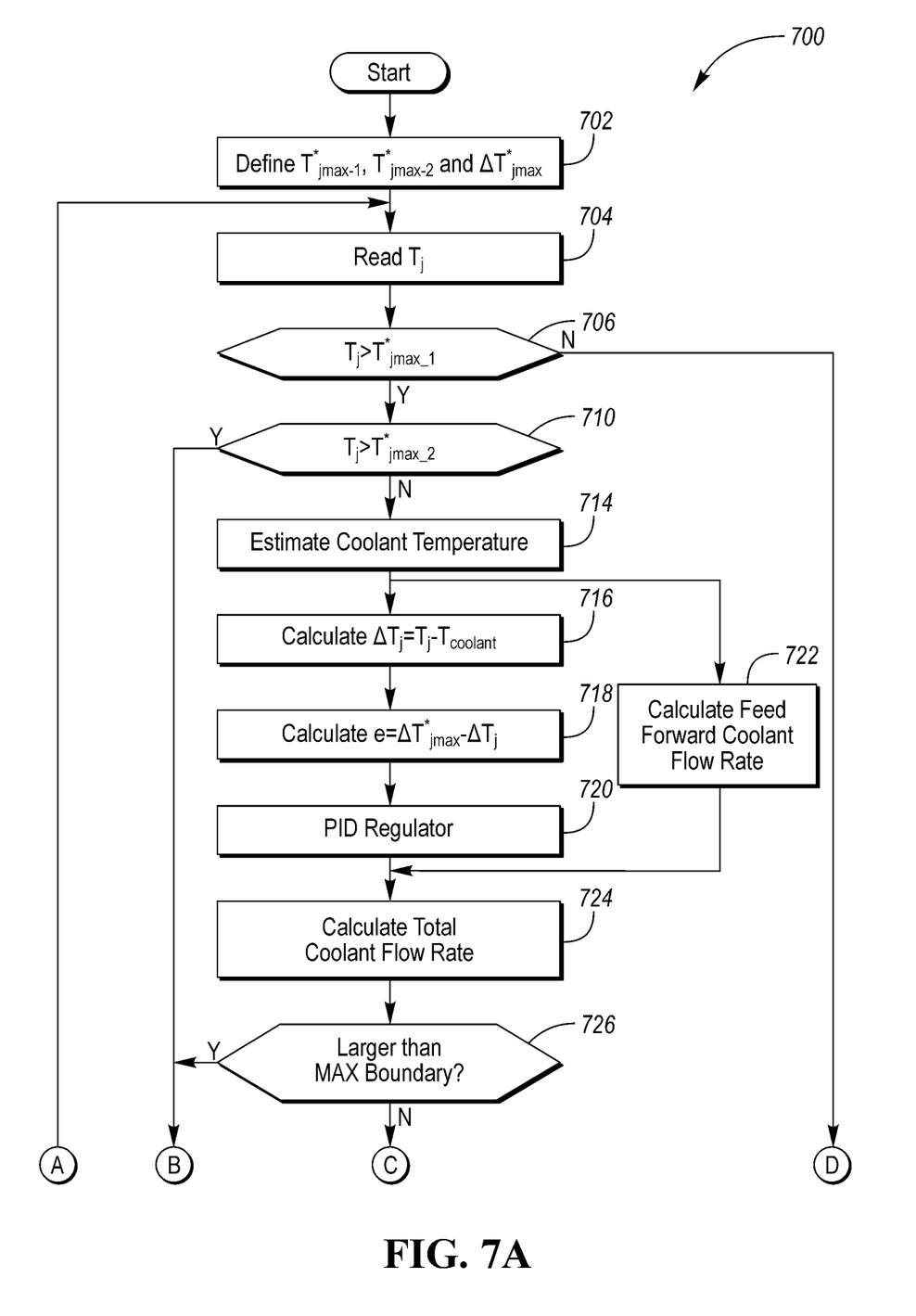
FIGS. 7A and 7B illustrate a temperature control system flow diagram for a traction power electronics system of an electrified vehicle.
Figure 7B:
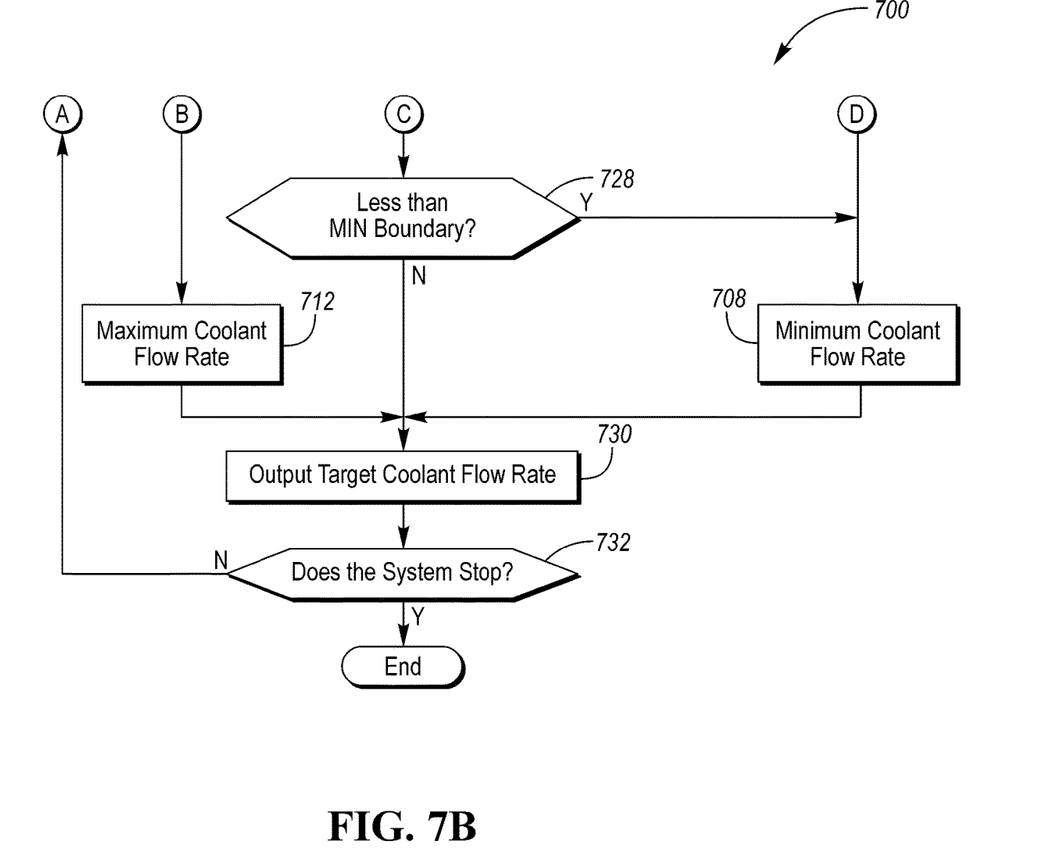

FIG. 7 is a temperature control system flow diagram 700 for a traction power electronics system of an electrified vehicle. Here a target coolant flow rate is set to a minimum boundary if the measured junction temperature is lower than $T^*_{jmax-1}$ and to maximum boundary if $T_j<T^*_{jmax-2}$. Otherwise, a target coolant flow rate is obtained by using a proportional-integral-derivative (PID) based coolant flow rate control method that includes feed forward control to provide fast dynamic response, while the PID feedback reduces steady state tracking errors. Their sum is compared with the SOA limitation such that, i) if the sum is less than minimum boundary of the SOA, the final output coolant flow rate is set to minimum coolant flow rate, ii) if the sum is larger than maximum boundary of the SOA, final output coolant flow rate is set to maximum coolant flow rate, and iii) otherwise, the sum is set to final output coolant flow rate.

In step 702, a controller will receive $T^*_{jmax-1}$, $T^*_{jmax-2}$, and $\Delta T^*_{jmax}$, in step 704 the controller will receive $T_j$ and in step 706 the controller will branch if $T_j<T_{jmax-1}$ to step 710. If $T_j \leq T_{jmax-1}$ the controller will branch to step 708. In step 708, the controller will set pump speed to a minimum coolant flow rate. In step 710 the controller will branch if $T_j<T_{jmax-2}$ to step 714. If $T_j>T_{jmax-2}$ the controller will branch to step 712. In step 712, the controller will set pump speed to a maximum coolant flow rate.

In step 714, the controller will estimate the coolant temperature and proceed to step 716. FIG. 6 illustrates a coolant temperature estimation flow diagram; however, this disclosure is not limited to the illustration of FIG. 6.

After the coolant temperature estimation, the data flows in two parallel paths, one is a feedforward path and the other is a feedback path. The feedback path includes steps 716-720 while the feedforward path is described in step 722.

In step 716, the controller will calculate a $\Delta T_j$, for example, $\Delta T_j$ may be expressed as $T_j - T_{coolant}$. The controller will proceed to step 718 to calculate an error "e", for example, the e may be expressed as $\Delta T^*_{jmax} - \Delta T_j$. The controller will then proceed to step 720 to provide a proportional-integral-derivative (PID) regulation. In parallel with these steps, the controller also performs, in step 722, a feedforward coolant flow rate estimation.

Figure 8:
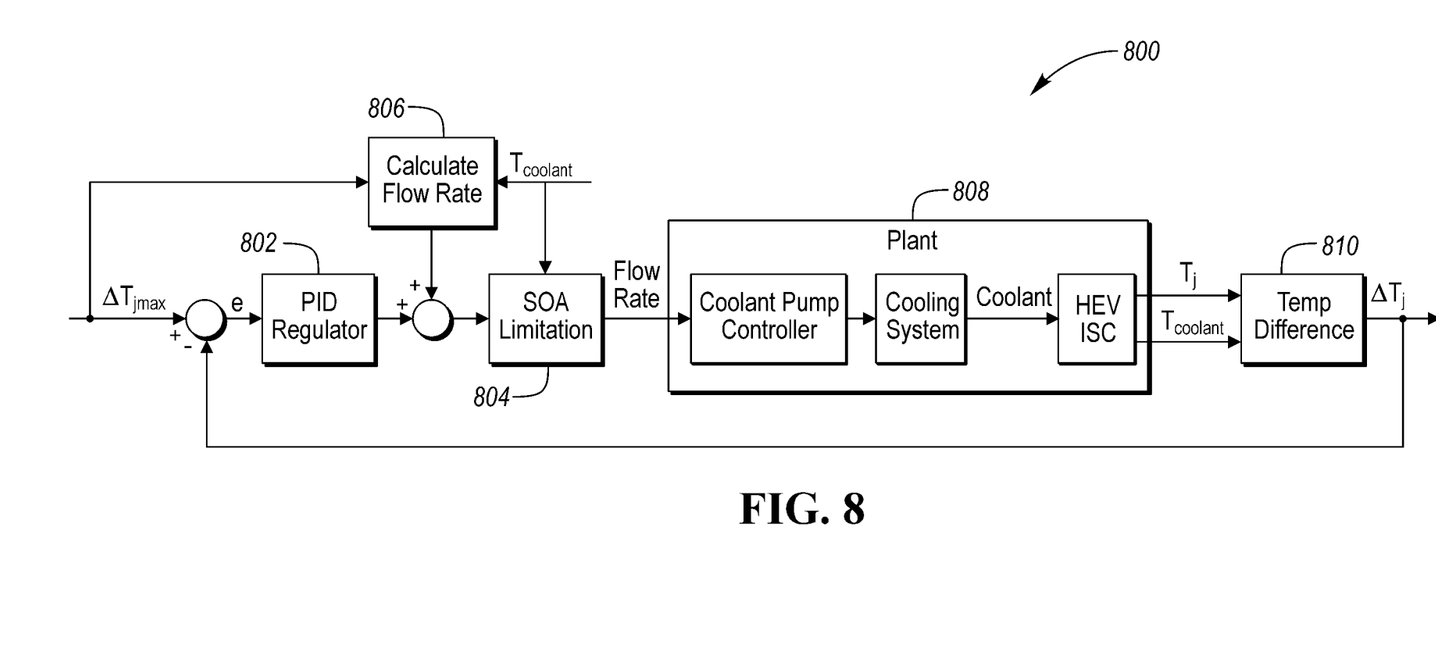
FIG. 8 is a block diagram of a coolant flow rate control system for an electric pump.

The feed forward estimation may be performed as shown in FIG. 8, a feedforward coolant flow rate is calculated by using $\Delta T^*_{jmax}$, coolant temperature $T_{coolant}$, and ISC SOA curve. As an example, the feed forward coolant flow rate can be obtained from FIG. 5, in which a current coolant temperature ($T_{coolant}$) and a maximum variation of the IGBT/diode junction temperature ($\Delta T^*_{jmax}$) are input and used to output the coolant flow rate. For example, consider an operating point at which the current coolant temperature ($T_{coolant}$) is 70° C. and a maximum variation of the IGBT/diode junction temperature ($\Delta T^*_{jmax}$) is 5° C., using the illustration of FIG. 5 provides a Coolant Flow Rate of 8 L/min. The maximum variation of the IGBT/diode junction temperature ($\Delta T^*_{jmax}$) is the difference between the maximum operating point 506 and the current coolant temperature ($T_{coolant}$). However, if the current coolant temperature ($T_{coolant}$) is 70° C. and a maximum variation of the IGBT/diode junction temperature ($\Delta T^*_{jmax}$) is 9° C., the Coolant Flow Rate would increase to 11 L/min.

The output front both the feedback and feedforward control steps is used to calculate a total coolant flow rate in step 724. The output of the total coolant flow rate step 724 is input to step 726 in which the controller branches based on the output exceeding a maximum boundary to step 712.

If the output does not exceed a maximum boundary, the controller will proceed to step 728. In step 728, the output of the total coolant flow rate of step 724 is input to step 728 in which the controller branches based on the output being less than a minimum boundary to step 708. If the output does exceed the minimum boundary, the controller will proceed to step 730. In step 730, the controller will output a target coolant flow rate (i.e., set a rotational speed of the electric pump) and proceed to step 732. In step 732, the controller will either loop back and continue to assess operation, or the system will stop.

In step 732, the controller will branch based on a status of the ISC operation. For example, when the ISC system is running (e.g., in an operating mode), the temperature controller will loop back to step 704. When the ISC system is not operating, (e.g., stopped), the controller will branch to stop.

FIG. 8 is a block diagram of a coolant flow rate control system for an electric pump. The control system 800, performed by a controller, includes a proportional-integral-differential (PID) regulator 802 that provides input to a ISC thermal safe operating area (SOA) determination block 804. The PID regulator 802 receives an error term (e.g., the output of step 718) based on a maximum temperature variation term (e.g., the output of step 716) offset by temperature difference. Along with the output of the PID block 802, SOA determination block 804 includes feedback from a flow rate calculator 806 that calculates a flow rate based on a temperature of the coolant. The SOA block 804 may include an analysis such as illustrated in FIG. 5. The output of the SOA block 804 is used by a plant model 808 to output a junction temperature and a coolant temperature that than calculates a difference in block 810 which is fed back to the ND controller. The plant model 808 may be used to drive electric coolant pump at a flow rate determined by the SOA limitation.

It is contemplated that the cooling system 300 may perform cooling optimization in response to HEV/EV driving (such as city drive, highway drive, mountain climbing or cruising) to achieve maximum cooling performance. It is also contemplated that a coolant flow rate may be dynamically controlled with a self-adaptive feature to automatically fulfill the demand-based responses of the vehicle 112 to actual driving circumstances. A closed-loop control system may be operable to increase the performance operation of the vehicle 112. Alternatively, an open-loop control that may not require any feedback tuning may also be implemented to increase the performance operation of the vehicle 112. It is contemplated that the temperature control system may be operable to monitor and control both maximum junction temperature and junction temperature variation. The temperature control system may also be operable to dynamically control the coolant flow rate using the coolant temperature, which may be estimated in real time. The temperature control system may also be operable to automatically match the drive demands, drive patterns, and drive conditions using a self-adaptive coolant flow rate to increase energy savings when the vehicle 112 is being operated. Lastly, it is contemplated that the durability of the Power Module (PM) and the lifetime operation of the inverter/vehicle may be increased by reducing the rise, swing, and cycling of the PM junction temperature.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read. Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to One or more characteristics are not outside the scope of the disclosure and can be desirable for particular applications.

What is claimed is:

1. A vehicular system comprising:
a pump configured to circulate coolant for a traction inverter; and
a controller configured to
responsive to each of a temperature of the traction inverter falling outside a first range or a requested flow rate of the pump falling outside a second range, operate the pump at a predefined speed,
otherwise, operate the pump at a speed based on a difference between the temperature and a temperature associated with the coolant.

2. They system of claim 1, wherein the temperature associated with the coolant is defined by a junction temperature of a variable voltage converter of the traction inverter.

3. The system of claim 1, wherein the temperature associated with the coolant is defined by a junction temperature of a motor inverter of the traction inverter.

4. The system of claim 1, wherein the temperature associated with the coolant is defined by a junction temperature of a generator inverter of the traction inverter.

5. The system of claim 1, wherein the speed is bounded by the predefined speed.

6. A method comprising:
by a controller,
responsive to a temperature of a traction inverter exceeding a first threshold, operate a pump to circulate coolant at a predefined speed,
responsive to a requested flow rate of the pump exceeding a second threshold, operate the pump at the predefined speed, and
otherwise, operate the pump at a speed based on a difference between the temperature and a junction temperature of the traction inverter.

7. The method of claim 6, wherein the junction temperature is associated with a variable voltage converter of the traction inverter.

8. The method of claim 6, wherein the junction temperature is associated with a motor inverter of the traction inverter.

9. The method of claim 6, wherein the junction temperature is associated with a generator inverter of the traction inverter.

10. The method of claim 6 further comprising defining the junction temperature according to a magnitude and duration of an output current of the traction inverter.

11. The method of claim 6 further comprising defining the junction temperature according to an operating mode of a variable voltage converter of the traction inverter.

12. A vehicular system comprising:
a pump configured to circulate coolant for a traction inverter; and
a controller configured to
responsive to a temperature of the traction inverter falling within a first range and a requested flow rate of the pump falling outside a second range, operate the pump at one of two predefined speeds,
responsive to the temperature falling within the first range and the requested flow rate falling within the second range, operate the pump at a speed based on a difference between the temperature and a junction temperature of the traction inverter, and
responsive to the temperature falling outside the first range, operate the pump at one of the two predefined speeds.

13. They system of claim 12, wherein the junction temperature is associated with a variable voltage converter of the traction inverter.

14. The system of claim 12, wherein the junction temperature is associated with a motor inverter of the traction inverter.

15. The system of claim 12, wherein the junction temperature is associated with a generator inverter of the traction inverter.

16. The system of claim 12, wherein the junction temperature is defined according to a magnitude and duration of an output current of the traction inverter.

17. The system of claim 12, wherein the junction temperature is defined according to an operating mode of a variable voltage converter of the traction inverter.

18. The system of claim 12, wherein the speed is bounded by the two predefined speeds.

* * * * *